United States Patent [19]
Pio et al.

[11] Patent Number: 5,793,673
[45] Date of Patent: Aug. 11, 1998

[54] DOUBLE POLYSILICON EEPROM CELL AND CORRESPONDING MANUFACTURING PROCESS AND PROGRAMMING METHOD

[75] Inventors: Federico Pio, Milan; Carlo Riva, Renate Brianza, both of Italy

[73] Assignee: SGS-Thomson Microelectronics S.r.l., Agrate-Brianza, Italy

[21] Appl. No.: 914,518

[22] Filed: Aug. 19, 1997

Related U.S. Application Data

[63] Continuation of Ser. No. 623,731, Mar. 29, 1996, abandoned, which is a continuation of Ser. No. 199,075, Feb. 18, 1994, abandoned.

[30] Foreign Application Priority Data

Feb. 19, 1993 [IT] Italy .................... 93830061.3
Feb. 19, 1993 [IT] Italy .................... 93830062.1

[51] Int. Cl.⁶ .......................... G11C 11/34; H01L 29/68
[52] U.S. Cl. .......................... 365/185.01; 365/185.16; 257/316; 257/326
[58] Field of Search .......................... 365/185, 178, 365/185.01, 185.16; 257/316, 326

[56] References Cited

U.S. PATENT DOCUMENTS

| | | | |
|---|---|---|---|
| 4,412,311 | 10/1983 | Miccoli et al. | 365/185 |
| 4,742,492 | 5/1988 | Smayling et al. | 365/218 |
| 4,852,062 | 7/1989 | Baker et al. | 365/185 |
| 5,079,603 | 1/1992 | Komuri et al. | 257/316 |
| 5,081,054 | 1/1992 | Wu et al. | 437/43 |
| 5,194,929 | 3/1993 | Ohshima et al. | 257/326 |
| 5,326,999 | 7/1994 | Kim et al. | 365/185 |
| 5,337,274 | 8/1994 | Ohji | 365/185.01 |
| 5,338,956 | 8/1994 | Nakamura | 365/185 |
| 5,416,349 | 5/1995 | Bergemont | 257/316 |
| 5,451,803 | 9/1995 | Oji et al. | 365/185.01 |
| 5,464,999 | 11/1995 | Berngemont | 365/185.01 |

FOREIGN PATENT DOCUMENTS

| | | | |
|---|---|---|---|
| 0 079 636 | 5/1983 | European Pat. Off. | H01L 29/60 |
| 0 379 693 | 8/1990 | European Pat. Off. | G11C 16/06 |

OTHER PUBLICATIONS

Cappelletti et al., "Failure Mechanisms of Flash Cell in Program/Erase Cycling," *IEEE*, pp. 291–293, IEDM Proc., Dec. 1994.

Keeney et al., "Complete Transient Simulation of Flash EEPROM Devices," *IEEE Transactions on Elec.* 39(12):2750–2756,1992.

Bampi et al., "A Modified Lightly Doped Drain Structure for VLSI MOSFET's," *IEEE Transactions on Electron Devices* 33(11):1769–1779, 1986.

Jin-Yeong Kang and Sang-soo Lee, "Fabrication and Operational Stability of Inverted Floating Gate E²PROM (Electrically Erasable Programmable Read Only Memory)," *Japanese Journal of Applied Physics*, 30(4):627–632, 1991.

*Primary Examiner*—David C. Nelms
*Assistant Examiner*—Huan Hoang
*Attorney, Agent, or Firm*—David V. Carlson; Bryan A. Santarelli; Seed and Berry LLP

[57] ABSTRACT

A method for programming a two-level polysilicon EEPROM memory cell, which cell is implemented in MOS technology on a semiconductor substrate and comprises a floating gate transistor and a further control gate overlying the floating gate with a dielectric layer therebetween, provides for the application of a negative voltage to the control gate during the cell write phase. This enables the voltages being applied across the thin tunnel oxide layer to be distributed so as to reduce the maximum amount of energy of the "holes" and improve the oxide reliability. In addition, by controlling the rise speed of the impulse to the drain region during the write phase, and of the impulse to the control gate during the erase phase, the maximum current flowing through the tunnel oxide can be set and the electric field being applied to the tunnel oxide kept constant, thereby the device life span can be extended.

22 Claims, 6 Drawing Sheets

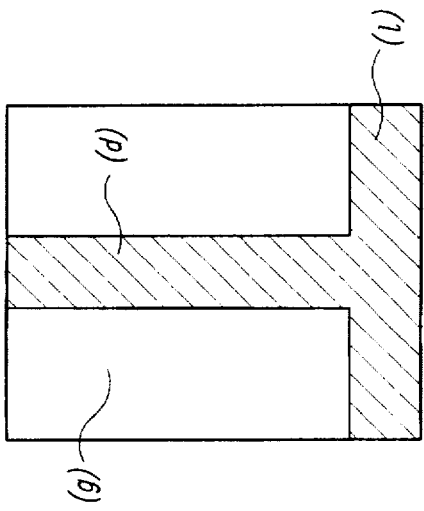
Fig. 1A ACTIVE AREAS
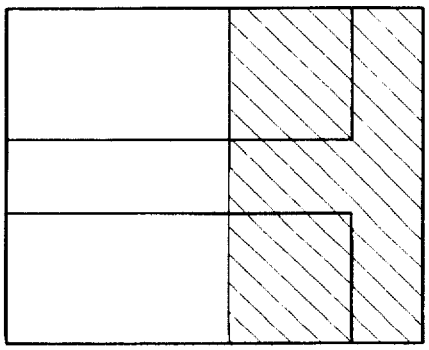
Fig. 1B TUNNEL OXIDE EPM IMPLANT
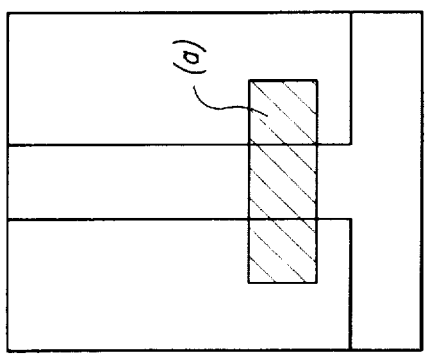
Fig. 1C FLOATING GATE
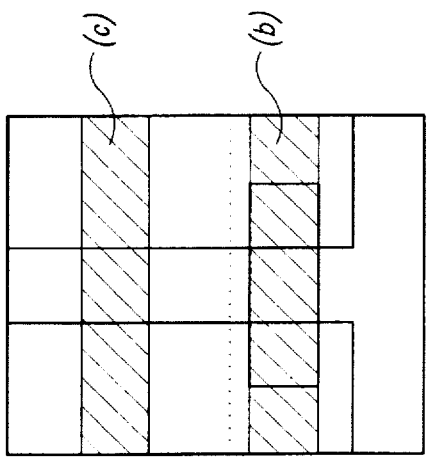
Fig. 1D POLY 2
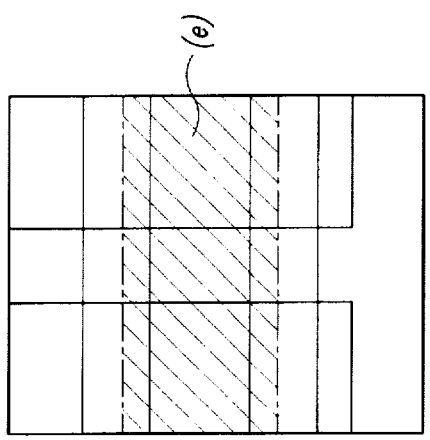
Fig. 1E PHOSPHORUS IMPLANT
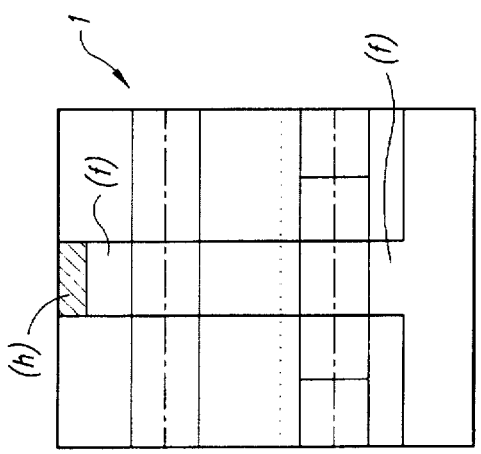
Fig. 1F CONTACT

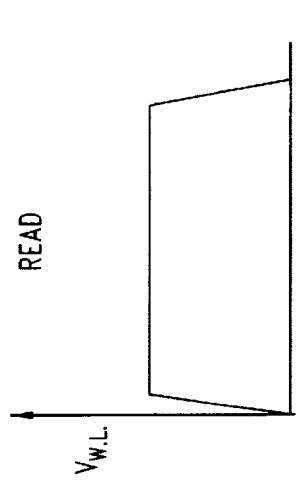
Fig. 15
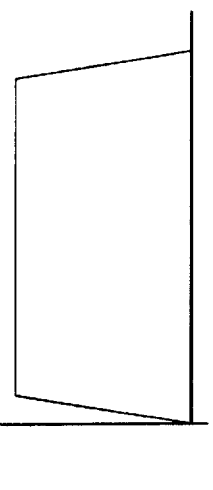
Fig. 16
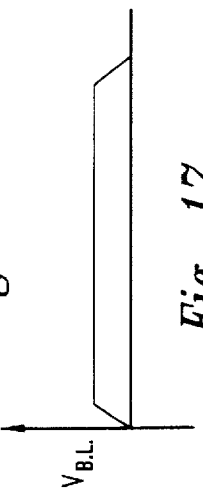
Fig. 17
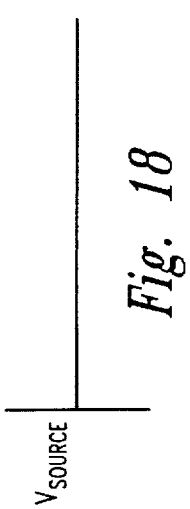
Fig. 18
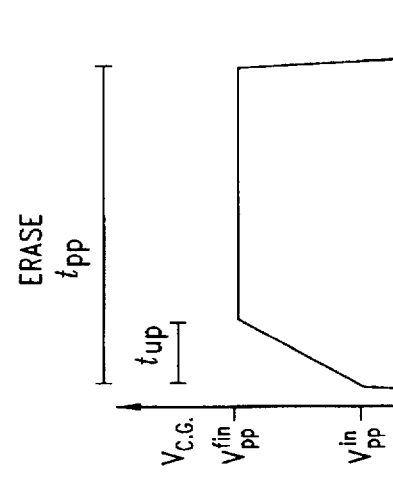
Fig. 13
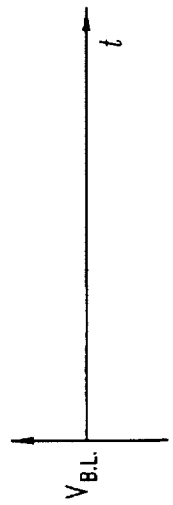
Fig. 14
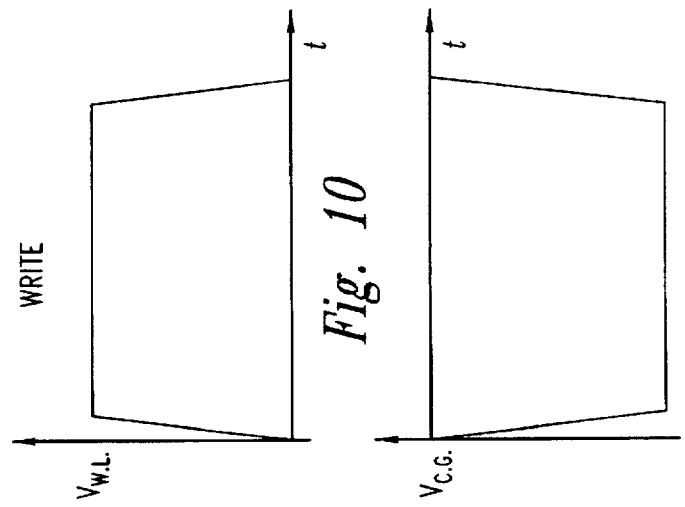
Fig. 10
Fig. 11
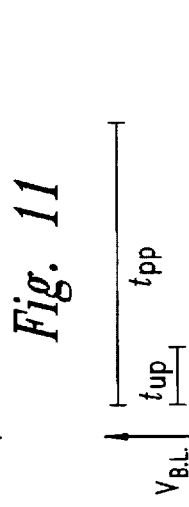
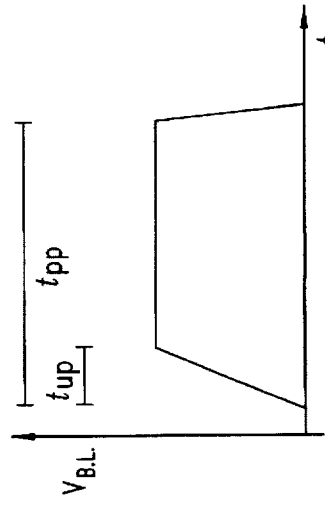
Fig. 12

DOUBLE POLYSILICON EEPROM CELL AND CORRESPONDING MANUFACTURING PROCESS AND PROGRAMMING METHOD

CROSS-REFERENCE TO RELATED APPLICATIONS

This application is a continuation of U.S. patent application Ser. No. 08/623,731, filed Mar. 29, 1996, now abandoned, which is a file-wrapper continuation application of U.S. patent application Ser. No. 08/199,075, filed Feb. 18, 1994, now abandoned, for "DOUBLE POLYSILICON EEPROM CELL AND CORRESPONDING MANUFACTURING PROCESS AND PROGRAMING METHOD".

TECHNICAL FIELD

This invention relates to an EEPROM memory cell having two levels of polysilicon, and in particular, to a two-level polysilicon EEPROM memory cell of a type having a floating gate transistor connected serially to a selection transistor and provided with a further control gate overlying the floating gate, an intermediate dielectric layer being interposed between said gates.

BACKGROUND OF THE INVENTION

As is well known, EEPROM memory structures, while being of the non-volatile type, allow the information stored therein to be altered electrically both during the write and the erase phases.

In essence, EEPROMs can have the state of any memory cells altered by tunneling electrons through a thin layer of silicon oxide. The thin oxide region has a smaller area than the so-called floating gate whereinto the electric charge is stored.

Memory cells with the above-outlined construction are referred to as FLOTOX, and are described, for example, in an article entitled "Oxide reliability criterion for the evaluation of endurance performance of electrically erasable programmable read-only memories", Journal App. Phys. 71, No. 9, 1992.

This kind of EEPROM memories falls into two general classes: a first class provided with a single level of polysilicon, and a second class having two discrete levels of polysilicon.

Memories of the first class have an advantage in that they can be manufactured by a comparatively simple process; but the overall circuit space requirements are much higher, usually by a factor of 1.5 to 2.5.

This penalizes memories with a single level of polysilicon in all those applications which require high circuit density, e.g. in excess of one Megabit.

It should be noted here that memories of either classes, whether with one or two levels of polysilicon, use positive voltages for both writing and erasing purposes. These voltages range from 8 to 12 Volts in order to generate a sufficiently strong electric field across the thin oxide to effectively trigger the tunnel effect.

However, the use of these relatively high positive voltages may eventually result in the thin oxide layer becoming deteriorated.

SUMMARY OF THE INVENTION

Accordingly, one object of the present invention is to provide a two-level polysilicon EEPROM cell which has such structural and functional features as to enhance the reliability and lifetime of storage circuits implemented with such cells, while reducing the tunnel oxide deterioration.

Another object of this invention is to enable very high density integrated storage circuits so that such circuits may be produced in a much smaller circuit area, for a given technology. This is apt to drastically lower the manufacturing costs for high density storage circuits.

According to principles of the present invention, there is provided a novel cell configuration which allows the voltages applied across the thin tunnel oxide layer to be distributed.

Based on that solutive idea, the objects of the invention are achieved by an EEPROM memory cell described and claimed herein.

The objects of the invention are achieved by a memory cell programming method as described herein.

The objects of the invention are achieved by a memory cell manufacturing process.

The features and advantages of a memory cell according to the invention will become apparent from the following description of an embodiment thereof, given by way of example and not of limitation with reference to the accompanying drawings.

BRIEF DESCRIPTION OF THE DRAWINGS

In the drawings:

FIGS. 1A–1G are top plan views showing schematically the layout of a memory cell embodying this invention;

FIGS. 10 to 12 are respective schematic graphs showing the patterns of programming impulses versus time, during the cell write phase;

FIGS. 13 and 14 are respective schematic graphs showing the patterns of programming impulses versus time, during the cell erase phase; and, FIGS. 15 to 18 are respective schematic graphs showing the patterns versus time of impulses applied to the cell during the read phase.

DETAILED DESCRIPTION

Figure 1G:
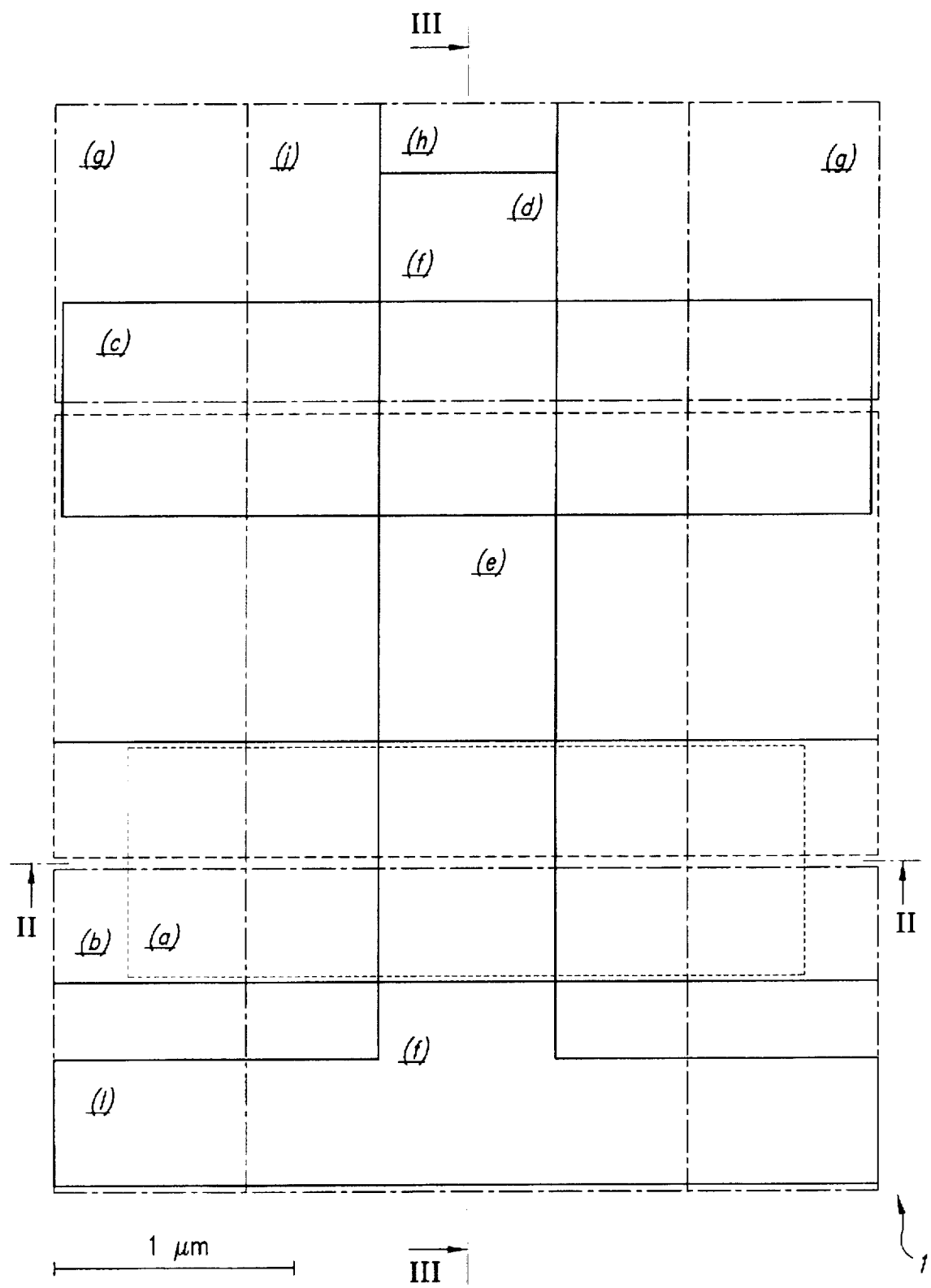

With reference to the drawing views, generally and schematically shown at 1 is an EEPROM memory cell embodying this invention. Understandably, the cell 1 would be a basic component of an integrated storage circuit incorporating thousands of identical cells in a matrix.

The structure of this cell 1 will next be described with cross reference to the steps of its manufacturing process.

The cell 1 is of the so-called two-level polysilicon type and has a basic structure which is consistent with a Flash cell of the ETOX type. In brief, the core of the memory cell comprises a MOS transistor having a floating gate 12 where the electric charge is stored which allows identification of the two discrete cell states of "write" and "erase".

The floating gate 12 is represented in FIG. 1C and FIG. 1G by a region (a) contoured by a dash line.

Provided above the floating gate 12 is a control gate electrode 15 comprising two overlapping layers of polysilicon 9 and silicide 13. In FIG. 1D and FIG. 1G, the control gate is represented by a region (b).

The control gate 15 is coupled capacitively to the floating gate 12 through an intervening dielectric layer 11, referred to as the interpoly layer dielectric. A voltage is transferred through this dielectric layer 11 to the floating gate 12 from the control gate 15 during the cell 1 write and/or erase phases.

Advantageously, the control gate electrode 15 is shared by all the cells forming one row or domain in the integrated storage circuit.

Connected serially to the floating-gate transistor of the cell 1 is a so-called selection transistor 14 which is designed to only operate at low voltages in the 5 to 7 Volts range. Region (c) in FIG. 1D and FIG. 1G shows the location of the word line which contains this selection transistor 14.

The gate of this transistor 14 is also formed of a double layer of polysilicon 9 and silicide 13, and is shared by all the cells in one row of the integrated matrix.

Figure 3:
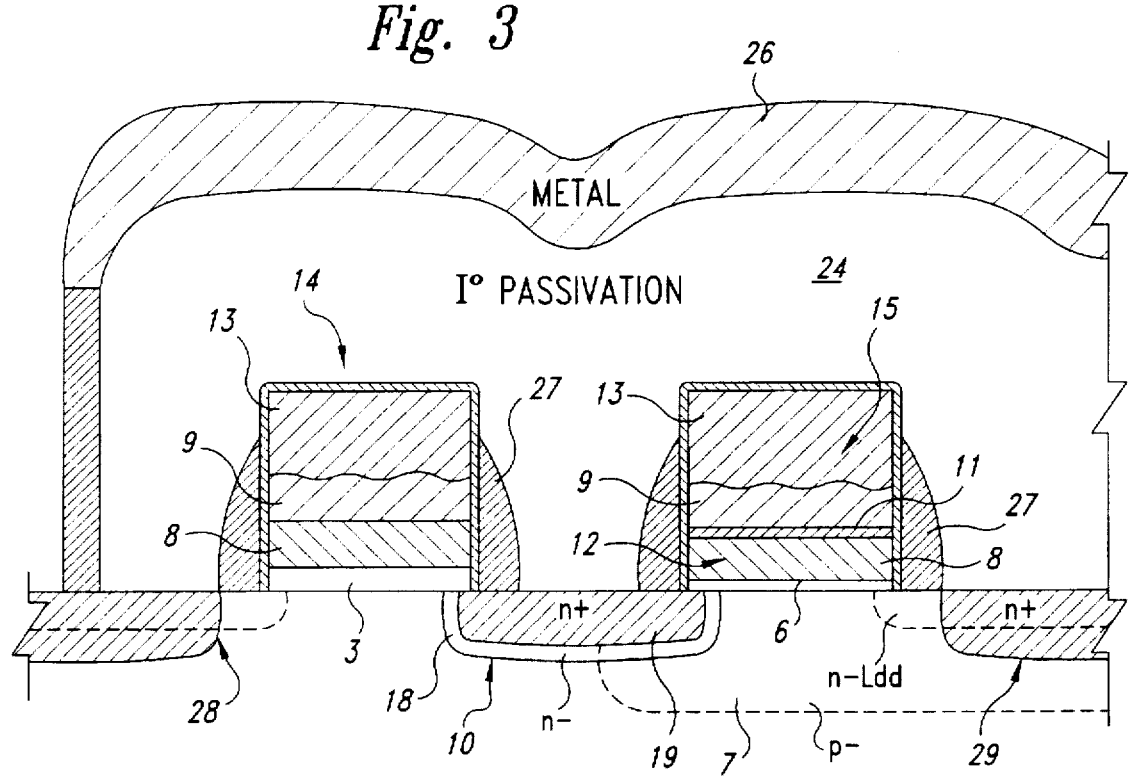
FIG. 3 is an enlarged scale, schematic view showing a vertical section through that same semiconductor portion but taken along line III—III in FIG. 1G.
Figure 4:
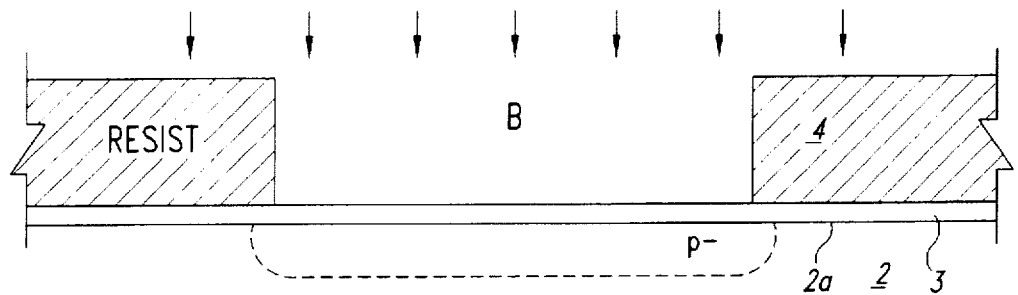
FIGS. 4 to 6 are respective schematic views showing, in vertical section and time succession, the initial steps of the manufacturing process to yield a pair of the cells shown in FIG. 1G.

Associated with the transistor 14 are active areas 20, shown in FIG. 3 and indicated in FIG. 1A and FIG. 1G by a region (d).

Advantageously according to the invention, provided between the respective gate terminals of the selection transistor 14 and the cell 1 is a region 10 which has at least a double implant of the same dopant type at two different concentrations and/or energies thereof.

In the instance considered, the dopant is of the N type and the implantation is effected using Phosphorus and Arsenic ions. Such a dual implant has shown to be specially effective to keep the so-called band-to-band (BTB) current low during the cell write phase.

In FIG. 1E and FIG. 1G, the region 10 is denoted by the character (e). This region 10 is formed by carrying out a first Phosphorus implantation at a low concentration of dopant N– and a subsequent, heavier implantation of Arsenic N+. Advantageously, the transistors forming the cell 1 have drain 28 and source 29 active regions of the selection transistor 14 and the floating-gate transistor respectively, obtained with an LDD (lightly doped drain) technology.

The reference character (f) denotes in FIG. 1F and FIG. 1G the drain and source regions of the cell 1. Indicated at (h) is, moreover, a drain contact in common with the cell 1 and a second cell which is formed above cell 1. This second cell is not explicitly shown as it is symmetrical with cell 1.

The reference character (i) in FIG. 1G denotes an interconnection metallic line between the drain contacts of cells in the same column of the cell matrix which makes up the integrated storage circuit.

Lastly, the reference character (l) in FIG. 1A and FIG. 1G denotes a line interconnecting the source regions which is shared by all the cells in the same row or domain of the matrix. This interconnection line (l) is also common to the source regions in the underlying row of symmetrical cells within the integrated circuit matrix.

Steps of the process for manufacturing memory cells according to the invention will now be described in detail.

The cell 1 is formed on a semiconductor substrate 2 with a 0.8 μm technology and having a control gate-to-floating gate capacitive coupling of about 0.6–0.7.

A gate oxide layer 3 is grown on the surface 2a of the substrate 2 by thermal oxidation. This layer 3 is specifically intended for the selection transistor 14.

Figure 5:
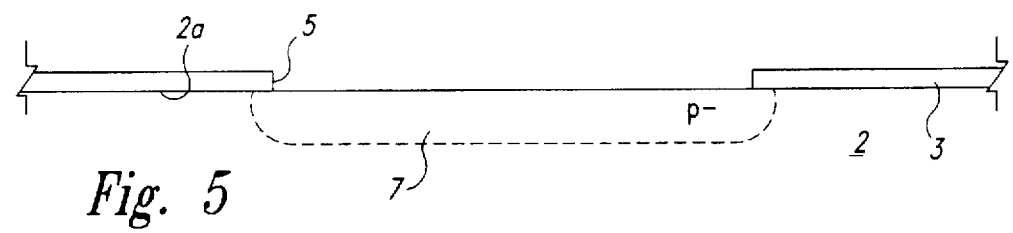
Figure 6:
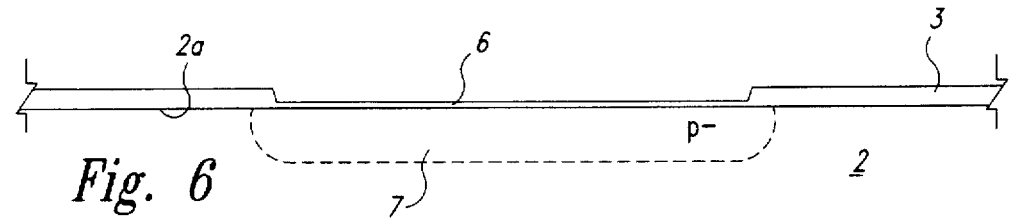

Using a conventional photolithographic technique whereby a layer 4 of a photoresist is deposited over the oxide 3, followed by etching, an aperture 5 is cut in the oxide layer 3 to define specifically the floating-gate transistor, as shown in FIG. 5. This aperture 5 will substantially expose again the surface 2a of the substrate 2.

Before the etching phase, an elongated channel region 7 which extends to beneath the opposite edges of the layer 3 is formed, proximate to the surface 2a, beneath the aperture 5 by ion implantation. The implantation is carried out using Boron ions to provide doping of the P– type in the region 7.

Figure 2:
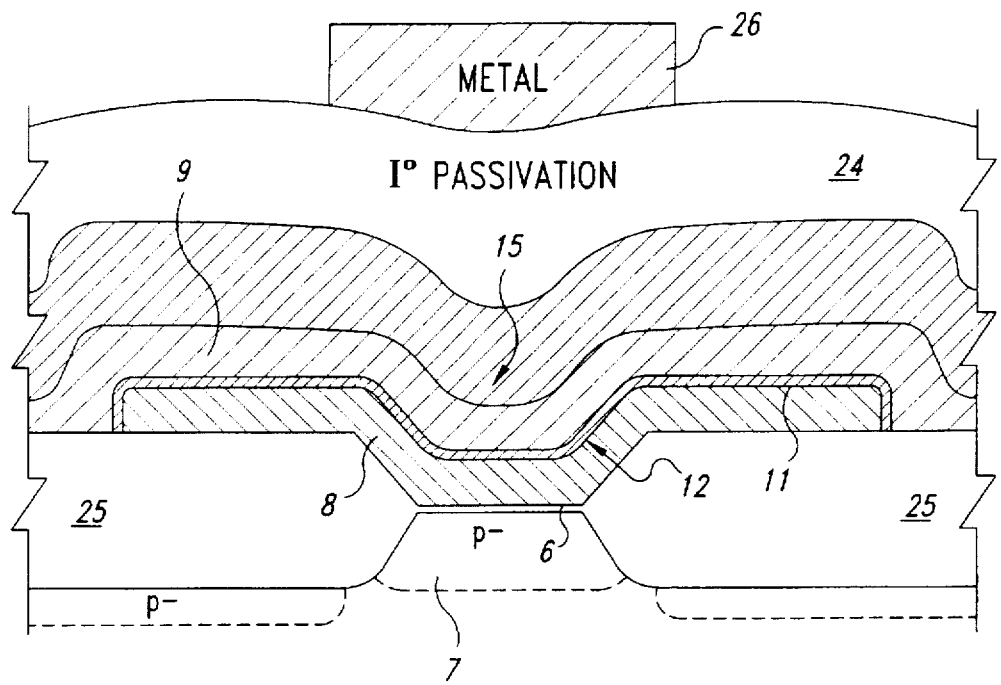
FIG. 2 is an enlarged scale, schematic view showing, in a vertical section taken along line II—II in FIG. 1G, a semiconductor portion on which the cell of this invention has been formed.

At this time, a thin oxide layer 6, referred to as the tunnel oxide hereinafter, is grown by thermal oxidation within the aperture 5. This tunnel oxide 6 is bounded laterally by opposite field oxide regions 25, as shown in FIG. 2 and denoted in FIG. 1 by the reference character (g).

The field oxide 25 delimits the active areas of the transistor with respect to the gate terminal.

Subsequent processing steps, known per se, will provide first 8 and second 9 polysilicon layers together with a silicide layer 13, intended for the structures of the floating gate 12 and the associated control gate 15 of the floating-gate transistor, as well as of the gate of the selection transistor 14.

Figure 7:
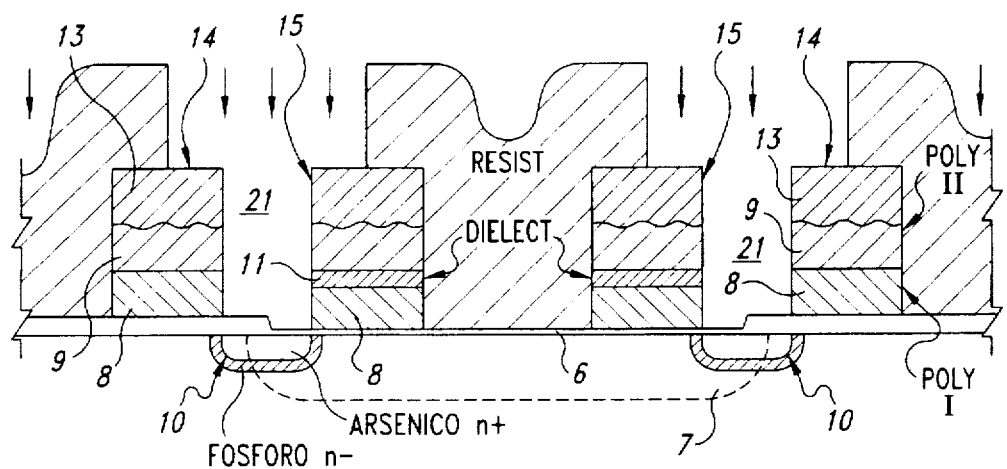
FIGS. 7 to 9 are respective schematic views showing, in vertical section and time succession, the final steps of the manufacturing process to yield a pair of the cells according to the invention.

Provided over the floating gate 12 between the first 8 and second 9 polysilicon layers, is the interpoly dielectric layer 11. The layer 11 may be left also on the selection transistor 14 if the first 8 and second 9 polysilicon layers are shortened on the field oxide. Using a photolithographic technique, respective apertures 21 are defined, throughout the layers 13, 9, 11 and 8, as far as the oxide layers 3 and 6, as shown in FIG. 7. These apertures 21 are cut between the respective gate terminals of each floating-gate transistor and each selection transistor 14 associated therewith resulting in a self-aligned structure.

A subsequent step of double ion implantation yields regions 10 which have two different concentrations of the same dopant type and extend partially under the floating gate 12.

Specifically, an implantation followed by diffusion of Phosphorus ions enables a first region 18 doped N– to be defined. This first region 18 will receive a second region 19 to be formed by implantation and successive diffusion with Arsenic ions.

Figure 8:
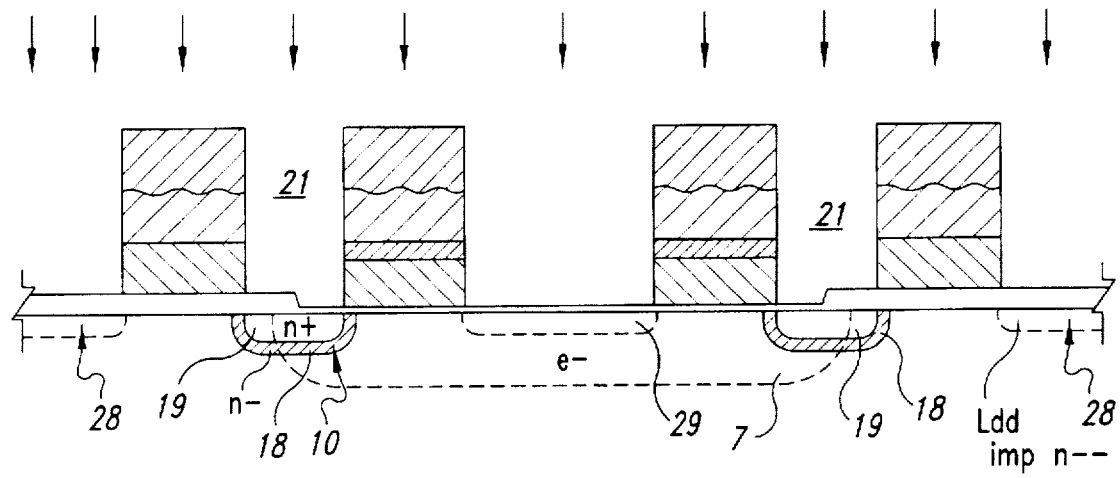
Figure 9:
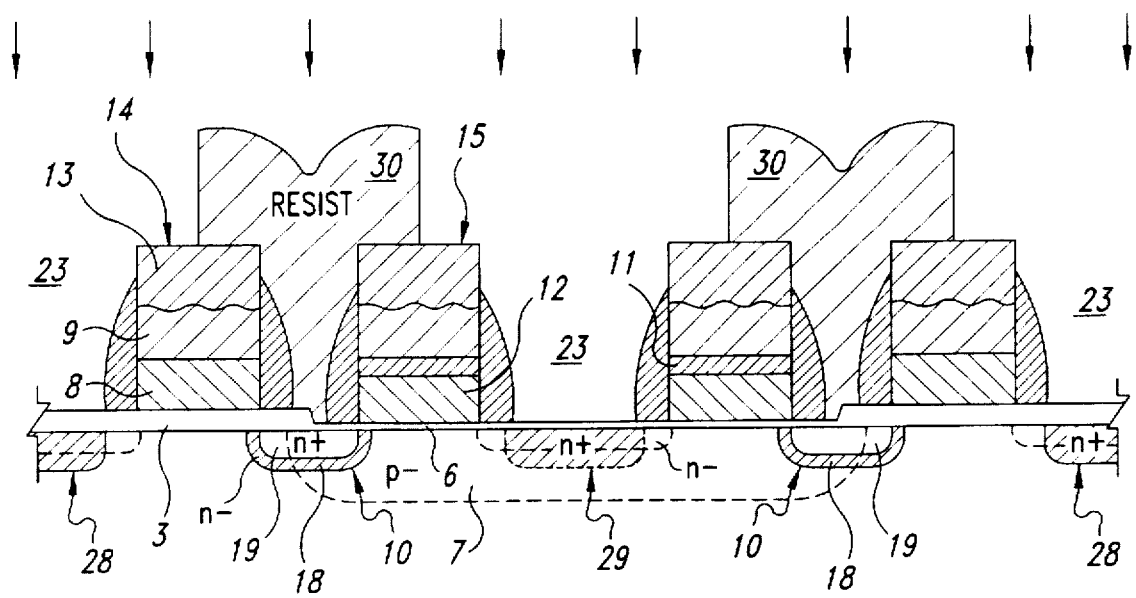

This second Arsenic implant is heavier than the previous Phosphorus implant, and the region 19 will have a concentration of dopant of the N+ type. The concentration gradient of the dopant N between the regions 18 and 19 lowers the so-called tunneling of the band-to-band current during the cell "write" phase. Similarly, shown schematically in FIG. 8 and FIG. 9 are the implantation steps which also enable the active drain and source areas 28 and 29 of selection transistor 14 and floating-gate transistor, respectively, to be doped.

Advantageously, this process step is carried out using a technique known as LDD at a low dopant concentration.

Both the drain area 28 of the selection transistor 14 and source area 29 of the floating gate transistor comprising the cell 1 are denoted by the reference character (f) in FIG. 1F and FIG. 1G.

At this stage, so-called spacers 27 are formed.

Moreover, a masking step with photoresist 30 protects the aperture 21 and allows fresh apertures 23 to be opened. An implantation is carried out with Arsenic N+ ions to complete the doping of the active areas 28 and 29, as shown in FIG. 9.

The process steps are completed with the deposition of a passivating layer 24, the formation of contact openings 30, and the provision of the final metallization layer 26. These, the very last, steps of the process are carried out in a conventional manner.

The method for programming the memory cell of this invention will now be described. In fact, the peculiarly innovative structure of this cell 1 allows it to be programmed in quite unique a manner.

For cell writing and erasing in conventional storage circuits, positive voltage pulses are applied to the cell terminals in order to generate a sufficient electric field to cause a current flow through the tunnel oxide layer.

By contrast, in the cell 1 of this invention, a negative voltage is used for application to the control gate 15 during the write phase.

Shown by way of example in the following Table are the values of the voltages to be applied across the cell 1. For each of the write, erase and read phases, there are specified the voltage values at the control gate 15, the bit line (drain contact), word line (gate of the selection transistor 14), and source diffusion 29. TABLE:

|       | C.G. | B.L. | W.L. | Source   |
|-------|------|------|------|----------|
| WRITE | −8 V | 5 V  | 7 V  | floating |
| ERASE | 15 V | 0 V  | 5 V  | floating |
| READ  | 3 V  | 1 V  | 5 V  | 0 V      |

When such negative voltage is used, the voltage being applied to the drain terminal can be reduced while retaining through the thin oxide 6 an electric field of the same level as in conventional cells.

This will reduce the maximum energy of the holes generated by the band-to-band current at the junction of the drain region. Accordingly, the deterioration of the thin tunnel oxide can be greatly reduced.

As shown in FIGS. 10 to 18, the programming impulses applied during the write phase to the drain contact, or applied during the erase phase to the control gate, are characterized by a rise speed that, in conjunction with the applied voltage values, will set the maximum current level through the thin oxide 6. By controlling this rise speed, the overall reliability of the cell can be improved while lowering the tunnel oxide stress.

In fact, during the write phase, control of the rise speed of the impulse on the bit line is effective to keep the electric field being applied across the tunnel oxide 6 constant over time. In this way the breakdown phenomenon attendant to the gate terminal voltage can be also controlled. In a similar way, during the erase phase, control of the rise speed values of the impulse at the control gate 15 enables the electric field being applied across the tunnel oxide 6 to be kept constant over time.

For completeness of discussion, it should be noted that it is only during the write phase that all the memory cells in one and the same word line could undergo stress from the negative voltage. This is because the cells are applied an electric field tending to deteriorate the informational content thereof.

However, this possible shortcoming can be fully controlled by suitable adjustment of the negative voltage value.

In this respect, in actual tests, using a programming time of 5 msec, durations of at least 100 k programming cycles have been obtained with no performance deterioration and no significant loss of information from the programming of other cells in the same row or domain of the cell matrix.

The memory cell of this invention does solve the prior art problems, and affords a number of advantages as specified herein below.

The particular self-aligned structure of the cell 1 allows it to be compacted, for a given technology, within an area which is less than one half that occupied by a conventional two-level polysilicon cell.

The use of a negative voltage to the control gate 15 of the cell, during the write phase, allows the required voltage across the tunnel oxide 6 to be distributed so as to provide the programming current sought. This also enables a standard selection transistor 14 to be used, and the use of a high voltage transistor avoided. In fact, the voltage which is transferred to the drain region of the cell is substantially on the order of 4–6 Volts.

The use of a suitable rise speed for the write and erase impulses allows the maximum current level through the tunnel oxide to be controlled and kept constant over time. Thus, the cell performance and long-term reliability can be improved by that the deterioration is reduced of the thin silicon oxide 6 subjected to the tunnel effect.

Also, the oxide deterioration problems which are typical of the Flash-type memory cells can be much attenuated.

In view of that the operation of the inventive cell is based on a Fowler-Nordheim tunnel effect and that its inherent threshold can be selected close to zero, the instant structure will specially suit low supply voltage applications, even ones as low as 3 Volts.

The overall electric length of the inventive cell is greater than that of a Flash cell, and in addition:

with the source being formed by the LDD method, the heavy Arsenic implant, peripherally of the source and the drain regions, can be held away from the cell gate.

The last-mentioned features of the invention are advantageous for very large scale integration of the inventive cell, increasing its effective electric length and allowing it to be scaled down to uniquely small sizes.

Understandably, changes and modifications may be made to the memory cell as described and illustrated in the foregoing without departing from the invention scope as defined in the appended claims.

We claim:

1. An EEPROM memory cell, comprising:

a selection transistor having a selection gate that sets the selection transistor in a conductive state upon application of a voltage;

a storage transistor having a floating gate and a control gate that are capacitively coupled by an intermediate dielectric layer;

an oxide layer positioned beneath both the selection gate of the selection transistor and the floating gate of the storage transistor; and a graded junction located immediately beneath the oxide layer, the graded junction having a first region that laterally extends beneath both the selection gate of the selection transistor and the floating gate of the storage transistor, the graded junction having a second region that is formed in the first region, is shallower than the first region, and laterally extends beneath both the selection gate and the floating gate, the first region laterally extending beneath the selection gate and the floating gate farther than the second region.

2. The EEPROM cell according to claim 1 wherein the oxide layer portion positioned below the selection gate of the selection transistor is a gate oxide and the oxide layer portion positioned below the floating gate of the storage transistor is a thin tunnel oxide.

3. The EEPROM memory cell of claim 1 wherein the first and second regions of the graded junction are formed using respective first and second concentrations of a same dopant type and wherein the first concentration is a lighter concentration than the second concentration.

4. The EEPROM memory cell of claim 3 wherein the type of dopant is a donor type dopant and wherein the first concentration is a concentration of phosphorous atoms and wherein the second concentration is a concentration of arsenic atoms.

5. A memory cell, comprising:
a first semiconductor region having a first doping profile and formed in a substrate having a surface;
a second semiconductor region formed in said substrate and having a second doping profile different from said first doping profile;
a third semiconductor region having said first doping profile and formed in said substrate;
a selection channel formed in said substrate and interposed between and contiguous with said first semiconductor region, and said second semiconductor region said selection channel being associated with no memory cells other than said memory cell;
a storage channel formed in said substrate and interposed between and contiguous with said second semiconductor region and said third semiconductor region;
a gate insulator formed on said selection and storage channels;
a selection gate formed on said gate insulator in alignment with said selection channel;
a floating gate formed on said gate insulator in alignment with said storage channel;
an interpoly dielectric formed on said floating gate; and
a control gate formed on said interpoly dielectric.

6. The memory cell of claim 5 wherein said second semiconductor region is doped N type.

7. The memory cell of claim 5 wherein said gate insulator comprises an oxide.

8. The memory cell of claim 5 wherein a portion of said gate insulator that is in alignment with said floating gate forms a tunnel oxide.

9. The memory cell of claim 5 wherein:
said first semiconductor region forms a drain of the memory cell; and
said third semiconductor region forms a source of the memory cell.

10. The memory cell of claim 9 wherein said drain is a lightly doped drain and said source is a lightly doped source.

11. The memory cell of claim 5 wherein said second semiconductor region includes a first portion having a first concentration of a first dopant of a predetermined type and a second portion having a second concentration of a second dopant of said predetermined type.

12. The memory cell of claim 11 wherein said first concentration is substantially less than said second concentration.

13. The memory cell of claim 11 wherein:
said first dopant includes phosphorous; and
said second dopant includes arsenic.

14. The memory cell of claim 11 wherein said first portion extends a first lateral distance beneath said selection gate and a second lateral distance beneath said floating gate.

15. The memory cell of claim 11 wherein:
said first portion extends a first lateral distance beneath said selection gate and a second lateral distance beneath said floating gate;
said second portion extends a third lateral distance beneath said selection gate and a fourth lateral distance beneath said floating gate; and
said first and second lateral distances respectively exceed said third and fourth lateral distances.

16. A memory circuit, having a semiconductor substrate that has a substrate surface, the memory circuit comprising:
one or more word lines;
one or more bit lines;
one or more control lines; and
an array of memory cells each including,
a drain formed in said substrate and coupled to one of said bit lines,
a source formed in said substrate,
a selection channel formed in said substrate and contiguous with said drain,
a storage channel formed in said substrate and contiguous with said source,
a gate insulator disposed on said substrate surface and in alignment with said selection and storage channels,
a selection gate disposed on said gate insulator in alignment with said selection channel and coupled to one of said word lines,
a floating gate disposed on said gate insulator in alignment with said storage channel,
an interpoly dielectric disposed on said floating gate,
a control gate disposed on said interpoly dielectric in alignment with said floating gate and coupled to one of said control lines, and
a graded junction formed in said substrate and interposed between and contiguous with said storage and selection channels, said graded junction including a first section doped with a first concentration of a first dopant of a predetermined type and a second section doped with a second concentration of a second dopant of said predetermined type, said second section laterally extending beneath said storage gate and said floating gate, said first section extending deeper into said substrate than said second section and laterally extending farther beneath said storage gate and floating gate than said second section.

17. The memory circuit of claim 16 wherein said predetermined dopant type is donor type.

18. The memory circuit of claim 16 wherein said second concentration is substantially greater than said first concentration.

19. The memory circuit of claim 16 wherein:
said first dopant includes phosphorous; and
said second dopant includes arsenic.

20. The memory circuit of claim 16 wherein said selection, floating, and control gates comprise polysilicon.

21. The memory circuit of claim 16 wherein said gate insulator includes a first portion that is in alignment with said floating gate and includes a second portion that is in alignment with said selection gate, said first portion significantly thinner than said second portion.

22. The memory circuit of claim 16 wherein said drain has a first region having a first concentration of said predetermined type of dopant, and has a second region having a second concentration of said predetermined type of dopant, said second region positioned between and contiguous with said first region and said selection channel; said source has a third region having a third concentration of said predetermined type of dopant, and has a fourth region having a fourth concentration of said predetermined type of dopant, said fourth region positioned between and contiguous with said third region and said selection channel, said third region laterally spaced from said floating gate; and said first and third concentrations respectively exceed said second and fourth concentrations.

* * * * *